US011930258B2

(12) United States Patent
Owaki

(10) Patent No.: US 11,930,258 B2
(45) Date of Patent: Mar. 12, 2024

(54) CAMERA MODULE, SPACER COMPONENT, AND METHOD FOR PRODUCING CAMERA MODULE

(71) Applicant: Sony Semiconductor Solutions Corporation, Kanagawa (JP)

(72) Inventor: Hirofumi Owaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 2 days.

(21) Appl. No.: 17/785,013

(22) PCT Filed: Dec. 11, 2020

(86) PCT No.: PCT/JP2020/046217
§ 371 (c)(1),
(2) Date: Jun. 13, 2022

(87) PCT Pub. No.: WO2021/125074
PCT Pub. Date: Jun. 24, 2021

(65) Prior Publication Data
US 2023/0008374 A1    Jan. 12, 2023

(30) Foreign Application Priority Data
Dec. 20, 2019   (JP) ................. 2019-230753

(51) Int. Cl.
*H04N 5/335*  (2011.01)
*H01R 12/71*  (2011.01)
(Continued)

(52) U.S. Cl.
CPC .......... *H04N 23/52* (2023.01); *H01R 12/716* (2013.01); *H04N 23/54* (2023.01); *H05K 1/0209* (2013.01);
(Continued)

(58) Field of Classification Search
CPC ............................................... H05K 2201/042
See application file for complete search history.

(56) References Cited

U.S. PATENT DOCUMENTS

| 2003/0202114 A1 | 10/2003 | Takizawa et al. |
| 2013/0215311 A1 | 8/2013 | Uemura |

(Continued)

FOREIGN PATENT DOCUMENTS

| CN | 109845239 A | 6/2019 |
| JP | 2000-241864 A | 9/2000 |

(Continued)

OTHER PUBLICATIONS

International Search Report and Written Opinion and English translation thereof dated Mar. 2, 2021 in connection with International Application No. PCT/JP2020/046217.

(Continued)

*Primary Examiner* — Gary C Vieaux
(74) *Attorney, Agent, or Firm* — Wolf, Greenfield & Sacks, P.C.

(57) ABSTRACT

A camera module according to an embodiment of the present technology includes a first component-mounting board, a second component-mounting board, and a spacer component. The first component-mounting board includes an imaging device. The second component-mounting board is electrically connected to the first component-mounting board. The spacer component is arranged between the first component-mounting board and the second component-mounting board. The spacer component includes a component body that is made of a first insulating material. The component body including a first primary-surface portion that includes a plurality of first reference surfaces including at least three first reference surfaces, a second primary-surface portion that includes a plurality of second reference surfaces including at least three second reference surfaces, and a (Continued)

component accommodation portion with or without a bottom, the first primary-surface portion being brought into contact with the first component-mounting board, the second primary-surface portion being brought into contact with the second component-mounting board, the component accommodation portion being provided to at least one of the first primary-surface portion or the second primary-surface portion.

14 Claims, 11 Drawing Sheets

(51) Int. Cl.
  *H04N 23/52* (2023.01)
  *H04N 23/54* (2023.01)
  *H05K 1/02* (2006.01)
  *H05K 13/00* (2006.01)
(52) U.S. Cl.
  CPC ..... *H05K 13/0015* (2013.01); *H01R 2201/18* (2013.01); *H05K 2201/042* (2013.01); *H05K 2201/10121* (2013.01); *H05K 2201/1059* (2013.01)

(56) References Cited

U.S. PATENT DOCUMENTS

| | | |
|---|---|---|
| 2018/0309912 A1 | 10/2018 | Park |
| 2019/0013419 A1 | 1/2019 | Murai |
| 2019/0124236 A1 | 4/2019 | Tsai |
| 2019/0222726 A1 | 7/2019 | Pan et al. |
| 2019/0227411 A1 | 7/2019 | Park et al. |
| 2020/0209596 A1* | 7/2020 | Kimura ................... G02B 5/20 |

FOREIGN PATENT DOCUMENTS

| | | |
|---|---|---|
| JP | 2003-348403 A | 12/2003 |
| JP | 2013-135405 A | 7/2013 |
| JP | 2013-179564 A | 9/2013 |
| JP | 2017-126883 A | 7/2017 |
| JP | 2019-530898 A | 10/2019 |
| WO | WO 2012/081051 A1 | 6/2012 |

OTHER PUBLICATIONS

International Preliminary Report on Patentability and English translation thereof dated Jun. 30, 2022 in connection with International Application No. PCT/JP2020/046217.

Extended European Search Report dated May 2, 2023 in connection with European Application No. 20901447.1.

\* cited by examiner

CAMERA MODULE, SPACER COMPONENT, AND METHOD FOR PRODUCING CAMERA MODULE

CROSS REFERENCE TO RELATED APPLICATIONS

This is a U.S. National Stage Application under 35 U.S.C. § 371, based on International Application No. PCT/JP2020/046217, filed Dec. 11, 2020, which claims priority to Japanese Patent Application JP 2019-230753, filed Dec. 20, 2019, each of which is hereby incorporated by reference in its entirety.

TECHNICAL FIELD

The present technology relates to a camera module that can be applied to, for example, an on-vehicle camera and a cellular phone, a spacer component, and a method for producing the camera module.

BACKGROUND ART

In the case of, for example, on-vehicle cameras and cellular phones, a plurality of boards is connected using board-to-board (hereinafter referred to as B-to-B) connectors (for example, Patent Literatures 1 and 2). It is important to ensure that a distance between (a degree of parallelism of) boards is maintained constant, in order to prevent, upon making the connection, load imposed on the plurality of boards when the plurality of boards is mounted, and damage due to oscillation generated after the plurality of boards is mounted.

Further, in the case of, for example, on-vehicle cameras, it is difficult to secure a space for adding a small, high-density component used to maintain a degree of parallelism of boards.

CITATION LIST

Patent Literature

Patent Literature 1: WO2012/081051
Patent Literature 2: Japanese Patent Application Laid-open No. 2013-135405

DISCLOSURE OF INVENTION

Technical Problem

Conventionally, a plurality of block-shaped spacer components is generally arranged away from B-to-B connectors, in order to secure flatness. However, when assembling is performed using a plurality of spacer components due to space constraints, there is an increase in accumulated tolerances including an individual difference between spacer components and assembling variations, and thus there is a reduction in the degree of parallelism. This may result in causing damage to a board.

Further, when a sufficient clearance (distance) between boards is maintained in order to avoid a short circuit caused between the boards, the difficulty in performing designing including designing a peripheral component will be increased, and, in addition, it will be difficult to perform handling since components are small.

In view of the circumstances described above, it is an object of the present technology to provide a camera module, a spacer component, and a method for producing the camera module that make it easy to perform handling, and make it possible to improve the degree of parallelism of boards.

Solution to Problem

In order to achieve the object described above, a camera module according to an embodiment of the present technology includes a first component-mounting board, a second component-mounting board, and a spacer component.

The first component-mounting board includes an imaging device.

The second component-mounting board is electrically connected to the first component-mounting board.

The spacer component is arranged between the first component-mounting board and the second component-mounting board. The spacer component includes a component body that is made of a first insulating material. The component body includes a first primary-surface portion that includes a plurality of first reference surfaces including at least three first reference surfaces, a second primary-surface portion that includes a plurality of second reference surfaces including at least three second reference surfaces, and a component accommodation portion with or without a bottom, the first primary-surface portion being brought into contact with the first component-mounting board, the second primary-surface portion being brought into contact with the second component-mounting board, the component accommodation portion being provided to at least one of the first primary-surface portion or the second primary-surface portion.

The plurality of first reference surfaces and the plurality of second reference surfaces may be respectively provided to a peripheral edge of the first primary-surface portion and a peripheral edge of the second primary-surface portion.

The component accommodation portion may include a first component-accommodation portion that is a through-hole, the first component-mounting board may further include a first connector component that is accommodated in the component accommodation portion, and the second component-mounting board may include a second connector component that is accommodated in the component accommodation portion and connected to the first connector component.

The component body may further include a plurality of engagement protrusions that controls misalignment between the spacer component and the first component-mounting board.

Each of the plurality of engagement protrusions may include a stem portion that is provided to a corresponding one of two side edges of the first primary-surface portion, the two side edges facing each other; and a claw portion that is provided to a tip of the stem portion, the claw portion being engaged with a surface of the first component-mounting board that is opposite to a surface of the first component-mounting board that faces the spacer component.

The first component-mounting board may include a plurality of concave portions each provided to a corresponding one of two side edges of the first component-mounting board, the stem portion being inserted into the concave portion.

The component accommodation portion may further include a second component-accommodation portion with a bottom, and the spacer component may further include a covering layer that is made of a second insulating material that is different from the first insulating material, the covering layer forming an inner surface of the second component-accommodation portion.

The second insulating material may be a composite material that includes an electromagnetic absorbent material.

The second component-accommodation portion may be provided to a portion that faces the imaging device in a thickness direction of the spacer component.

The second insulating material may be more highly thermally conductive than the first insulating material.

The spacer component may further include an interlayer connection portion that is provided within the component body, the interlayer connection portion making an electrical connection between the first component-mounting board and the second component-mounting board.

A casing that integrally accommodates therein a multilayer body of the first component-mounting board, the spacer component, and the second component-mounting board, may be further included.

A spacer component according to an embodiment of the present technology includes a component body that is made of an insulating material.

The component body includes a first primary-surface portion that includes a plurality of first reference surfaces, a second primary-surface portion that includes a plurality of second reference surfaces, and a component accommodation portion with or without a bottom, the first primary-surface portion being brought into contact with a first component-mounting board, the second primary-surface portion being brought into contact with a second component-mounting board, the component accommodation portion being provided to at least one of the first primary-surface portion or the second primary-surface portion.

A method for producing a camera module according to an embodiment of the present technology includes providing a spacer component that is made of an insulating material, the spacer component including a first primary-surface portion that includes a plurality of first reference surfaces, a second primary-surface portion that includes a plurality of second reference surfaces, and a component accommodation portion without a bottom, the first primary-surface portion being brought into contact with a first component-mounting board that includes an imaging device, the second primary-surface portion being brought into contact with a second component-mounting board, the component accommodation portion being provided to at least one of the first primary-surface portion or the second primary-surface portion;

arranging the first component-mounting board in snap-fit connection with the spacer component;

placing the first component-mounting board on the plurality of first reference surfaces to cause a first connector component to be accommodated in the component accommodation portion, the first connector component being mounted on the first component-mounting board;

turning the spacer component upside down; and placing the second component-mounting board on the plurality of second reference surfaces to connect a second connector component to the first connector component in the component accommodation portion, the second connector component being mounted on the second component-mounting board.

Figure 1:
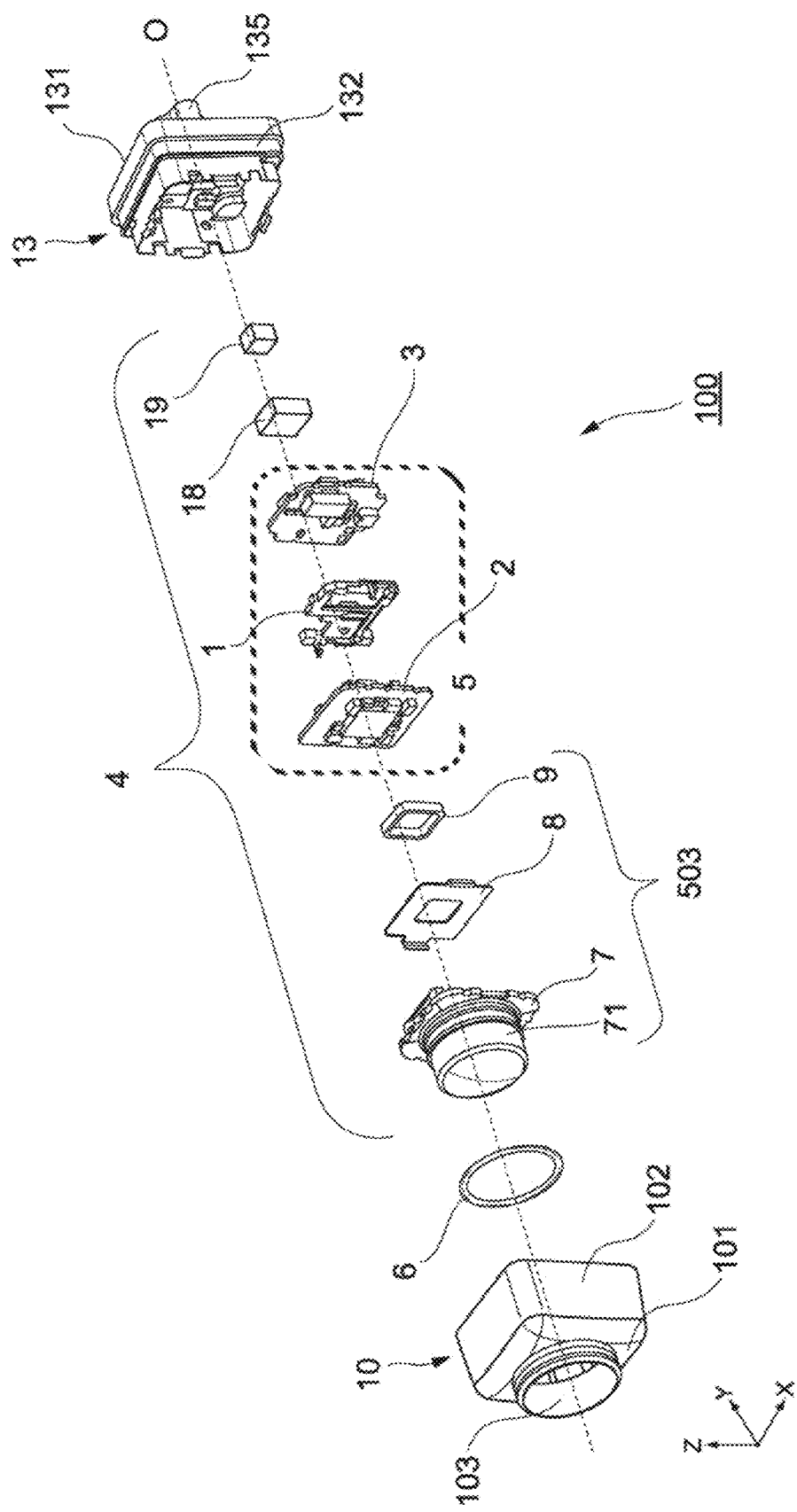
FIG. 1 is an exploded perspective view of a camera module according to an embodiment of the present technology.
Figure 4:
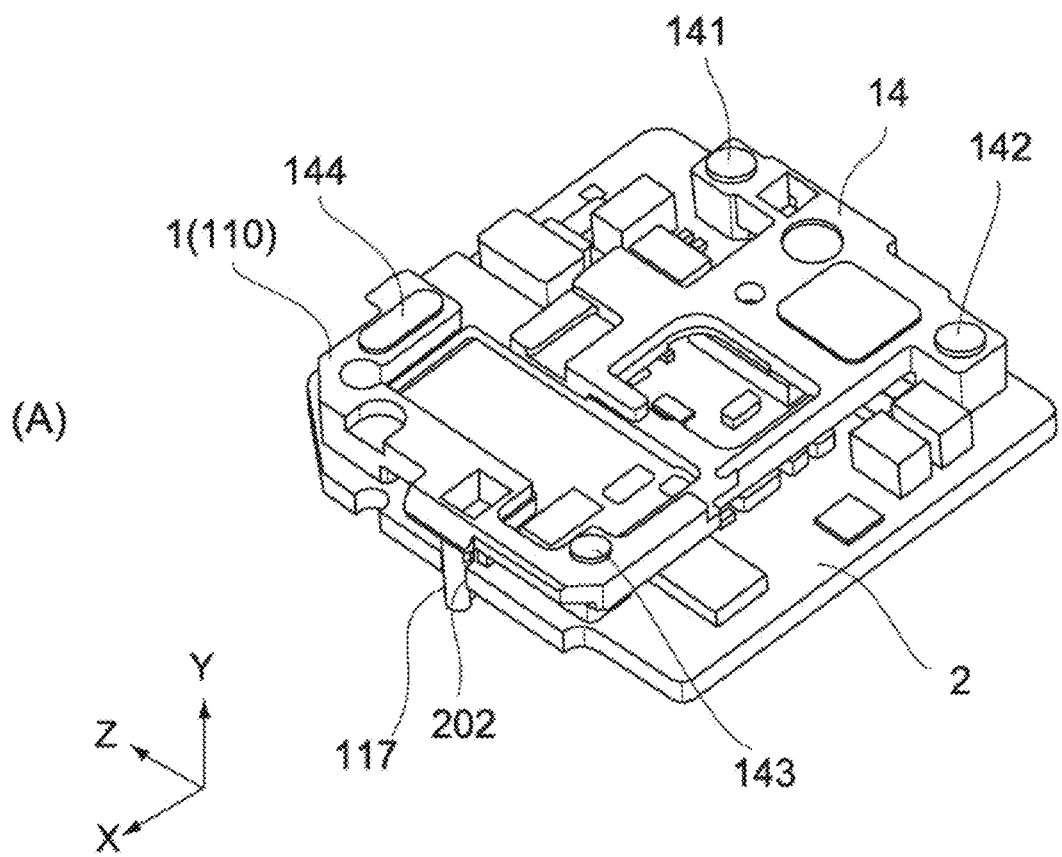
Figure 4:
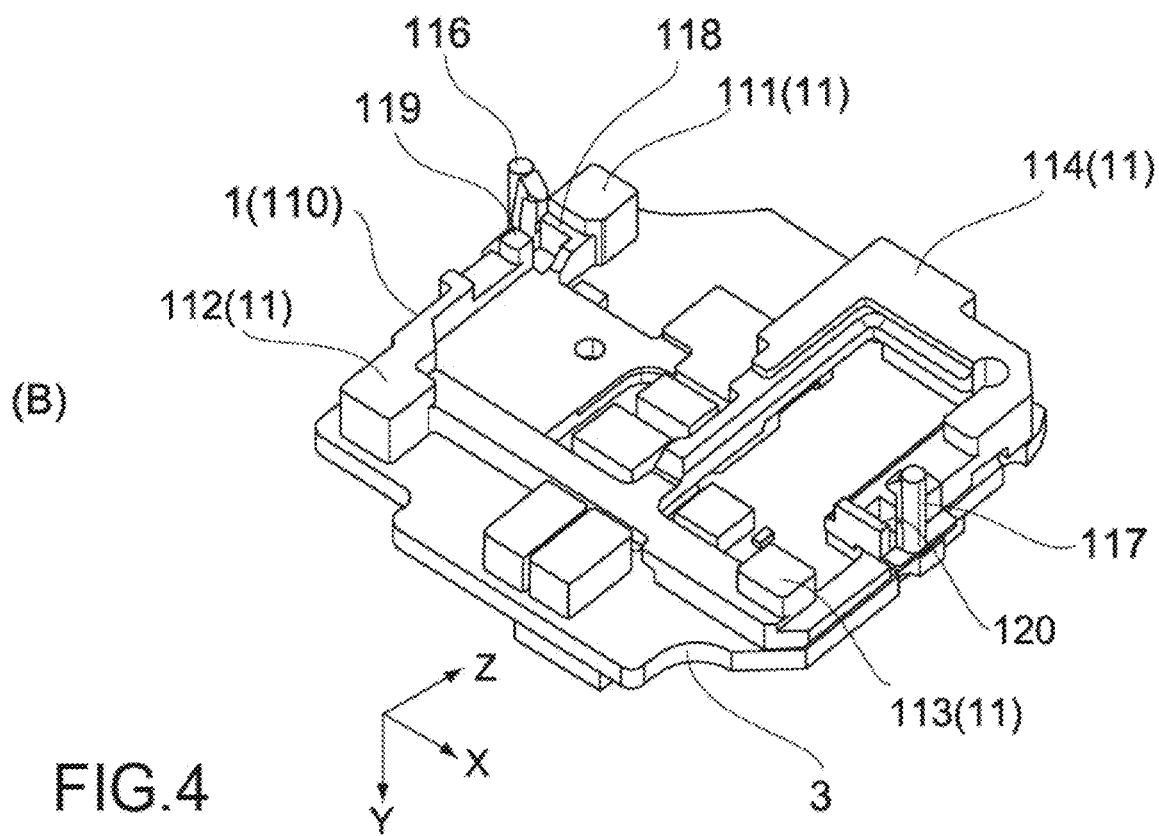

(A) of FIG. 4 is a bottom perspective view illustrating a state in which the spacer component is assembled to the front board in the camera module of FIG. 1, and (B) of FIG. 4 is a top perspective view illustrating a state in which the spacer component is assembled to the rear board in the camera module of FIG. 1.

Figure 5:
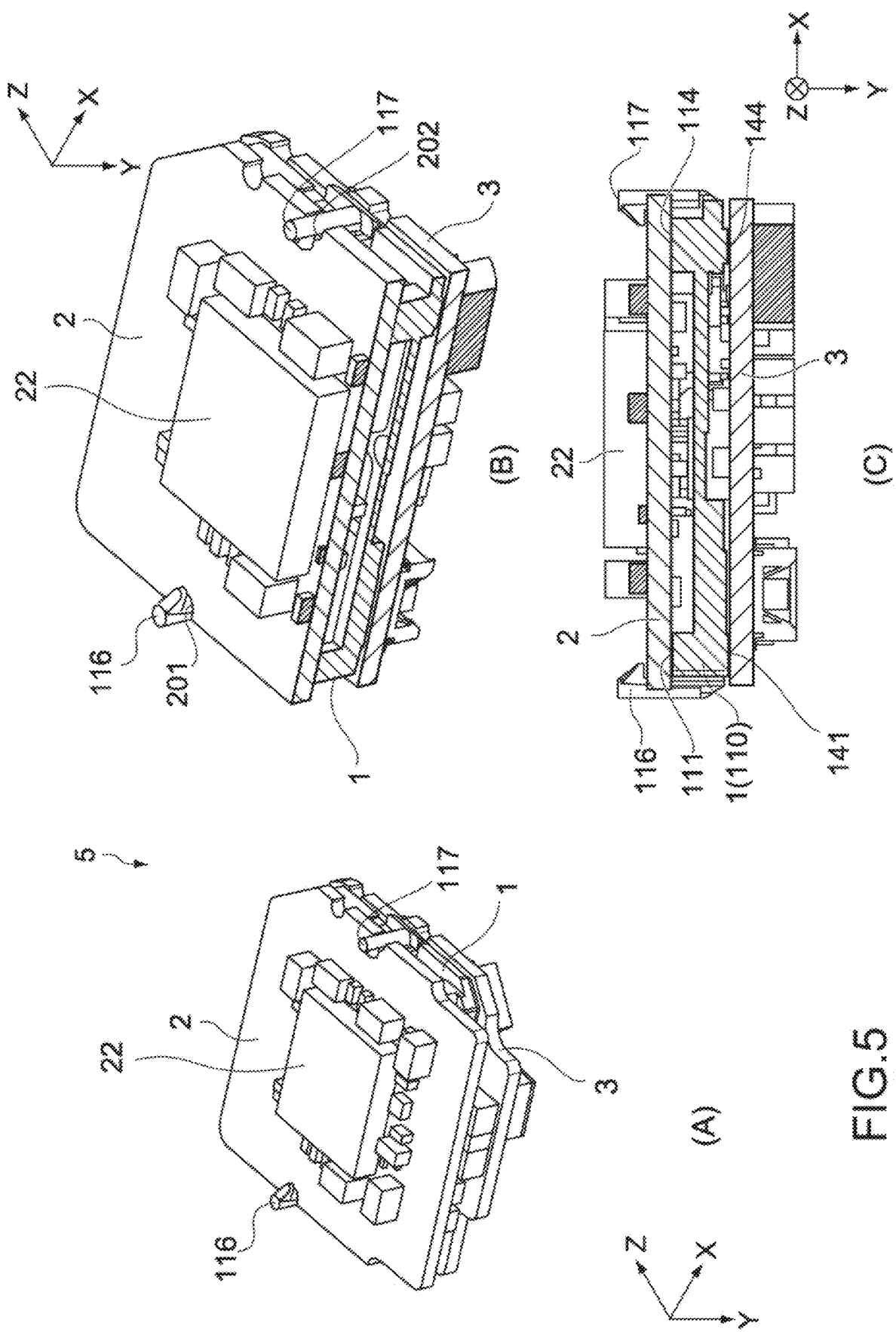

(A) of FIG. 5 is a top perspective view illustrating a state in which the spacer component is assembled to the front board and the rear board of FIG. 1, (B) of FIG. 5 is a cross-sectional perspective view illustrating the state of (A), and (C) of FIG. 5 is a cross-sectional side view illustrating the state of (A).

Figure 6:
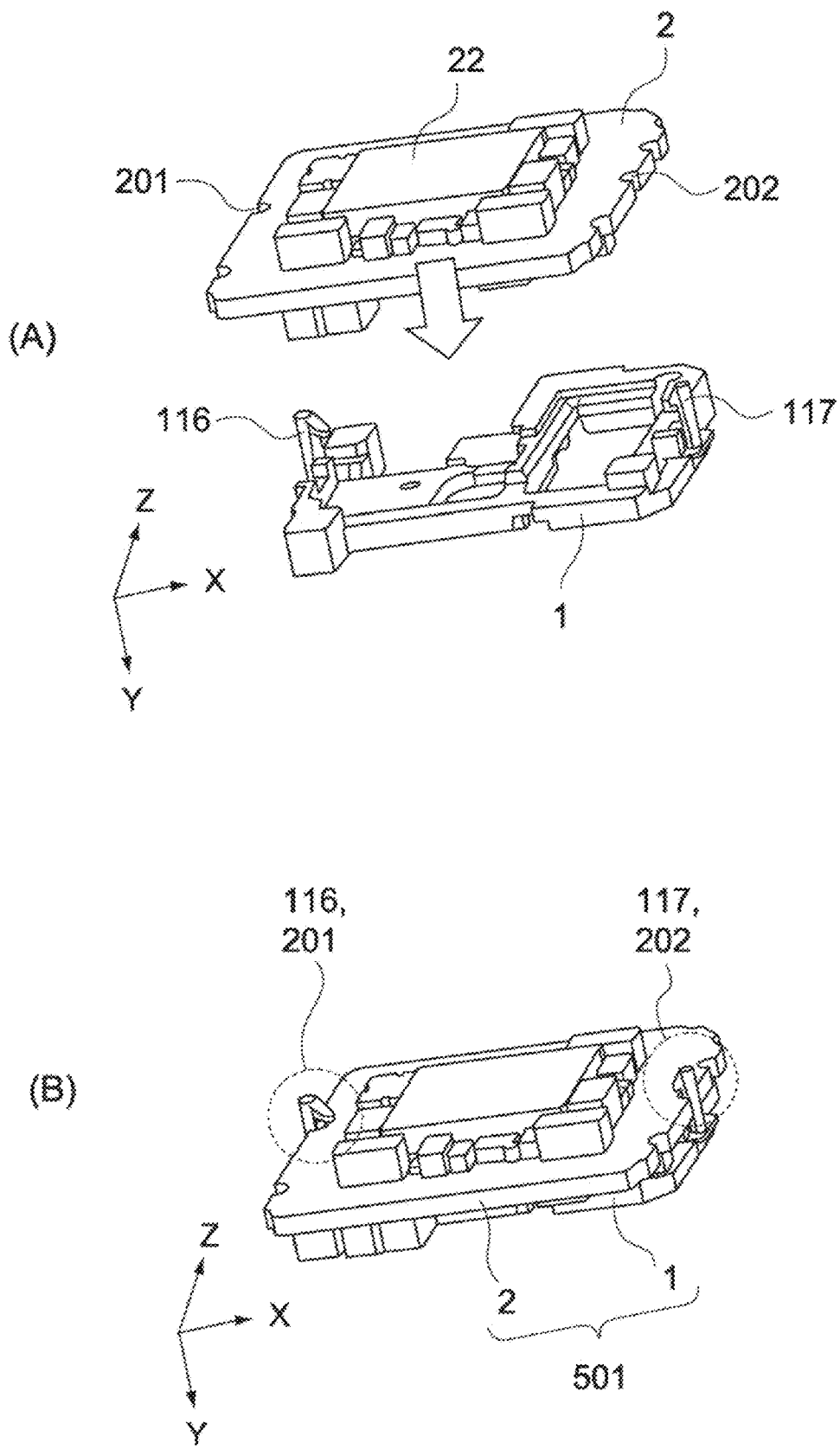

FIG. 6 is a perspective view illustrating how the front board is assembled to the spacer component of FIG. 1.

Figure 7:
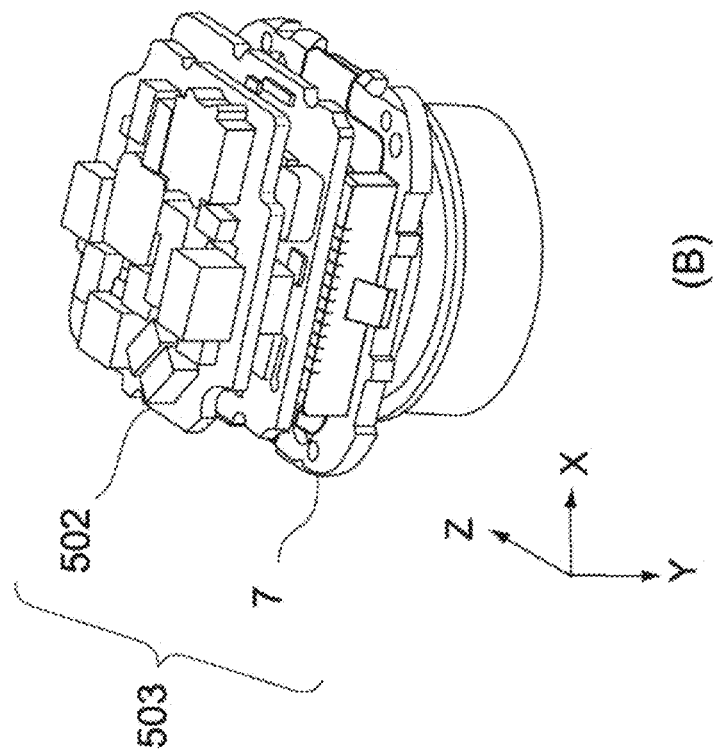
Figure 7:
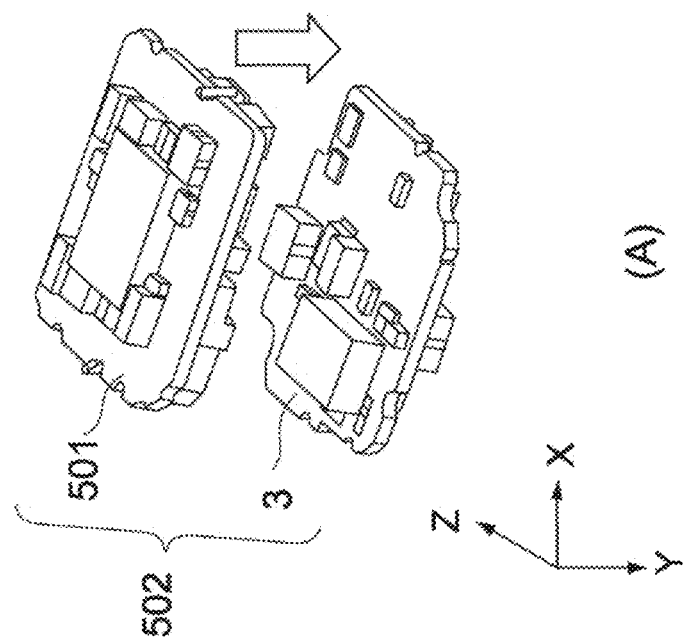

(A) of FIG. 7 is a perspective view illustrating a state in which the rear board is assembled into the spacer component and the front board of FIG. 6. (B) of FIG. 7 is a perspective view illustrating a state in which a multilayer body of (A) of FIG. 7 is assembled to a multilayer body of a lens assembly, a shield case, and a dustproof sheet.

Figure 8:
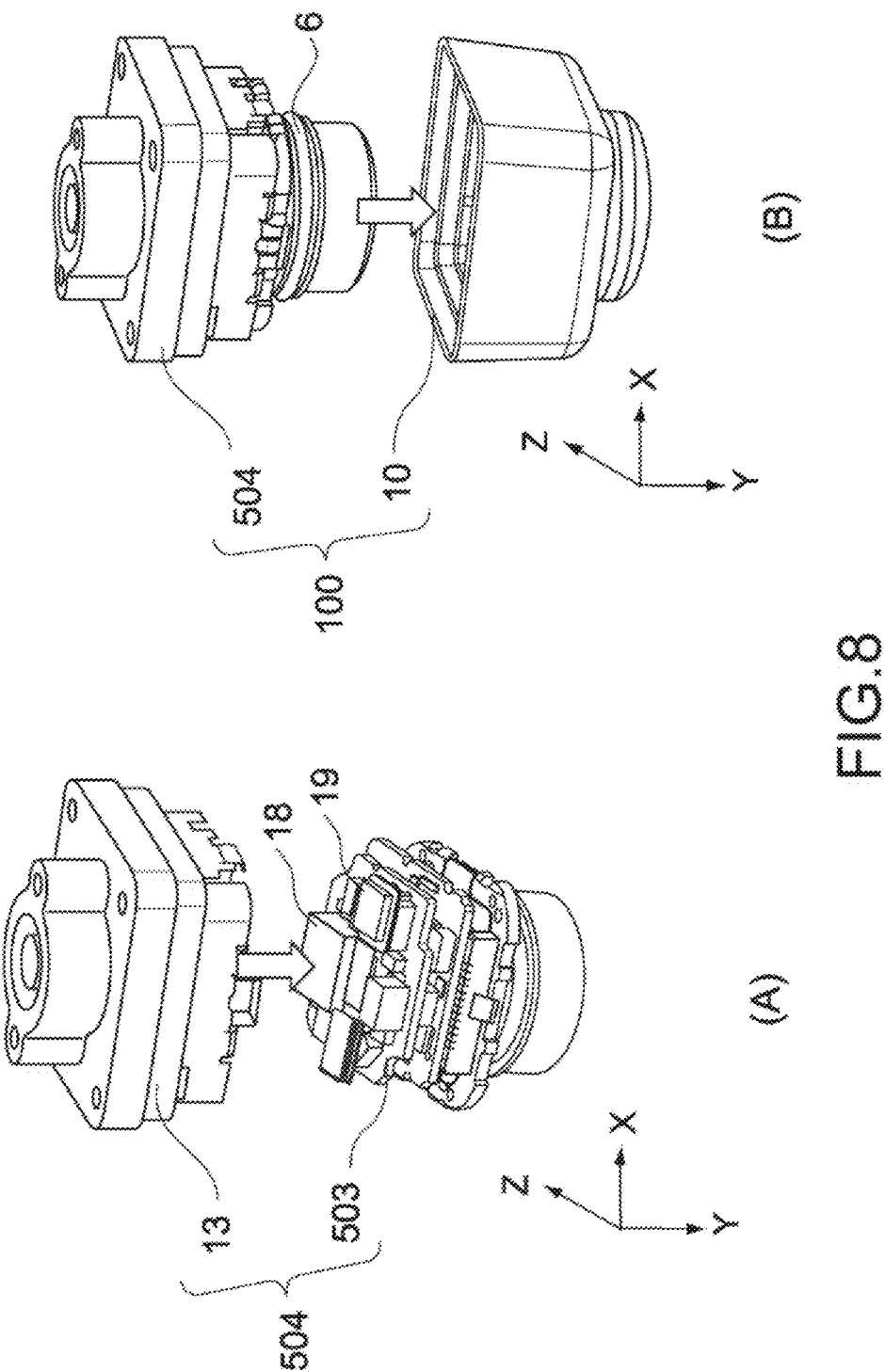

(A) of FIG. 8 is a perspective view illustrating a state in which a multilayer body of (B) of FIG. 7 to which a heat dissipating sheet and a spacer cushion are assembled, is assembled to a rear case. (B) of FIG. 8 is a perspective view illustrating a state in which a multilayer body of (A) of FIG. 8 to which an O-ring is assembled, is assembled to a front case.

Figure 9:
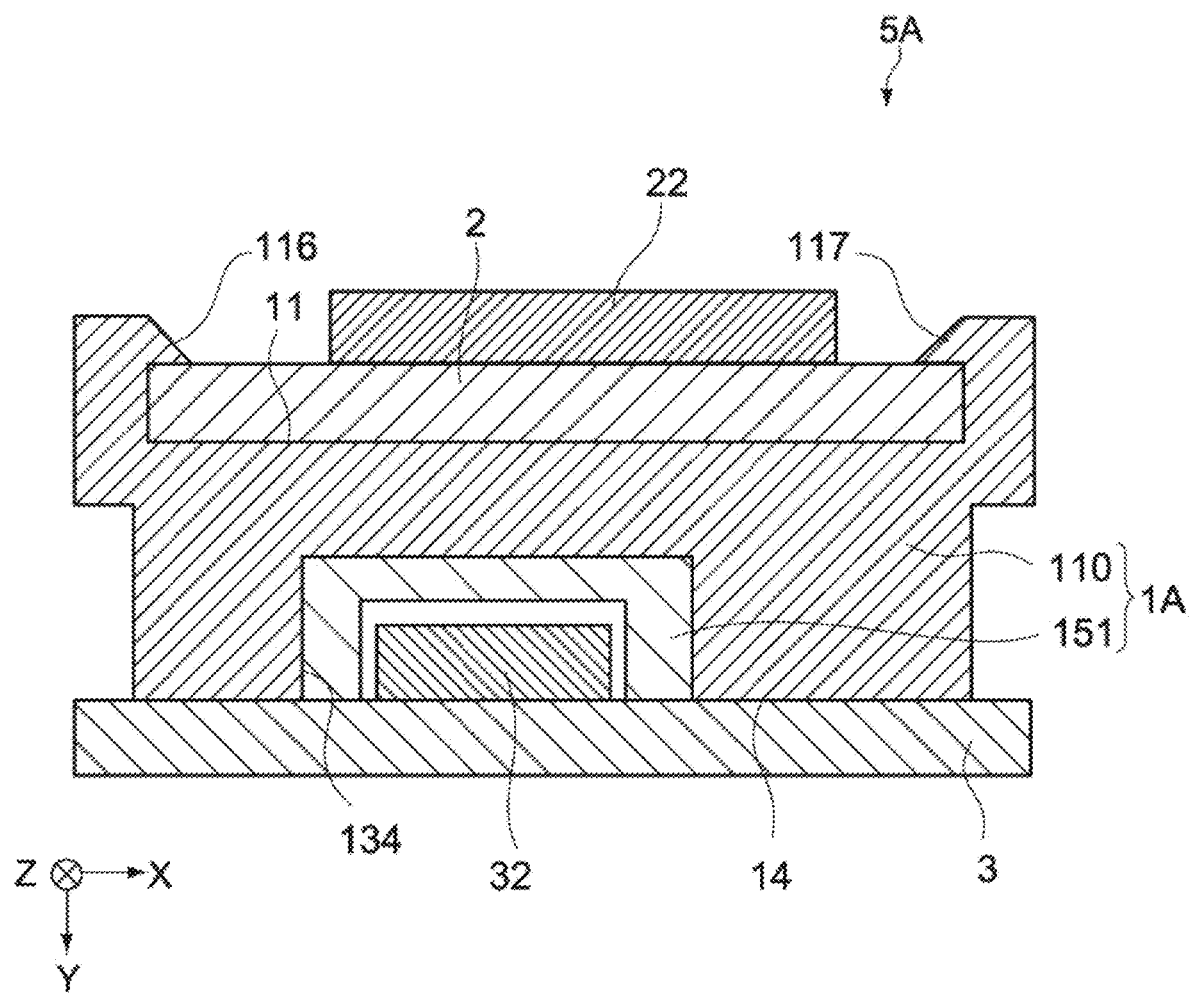

FIG. 9 is a cross-sectional side view schematically illustrating a state in which a spacer component according to another embodiment of the present technology is assembled to the front board and the rear board.

Figure 10:
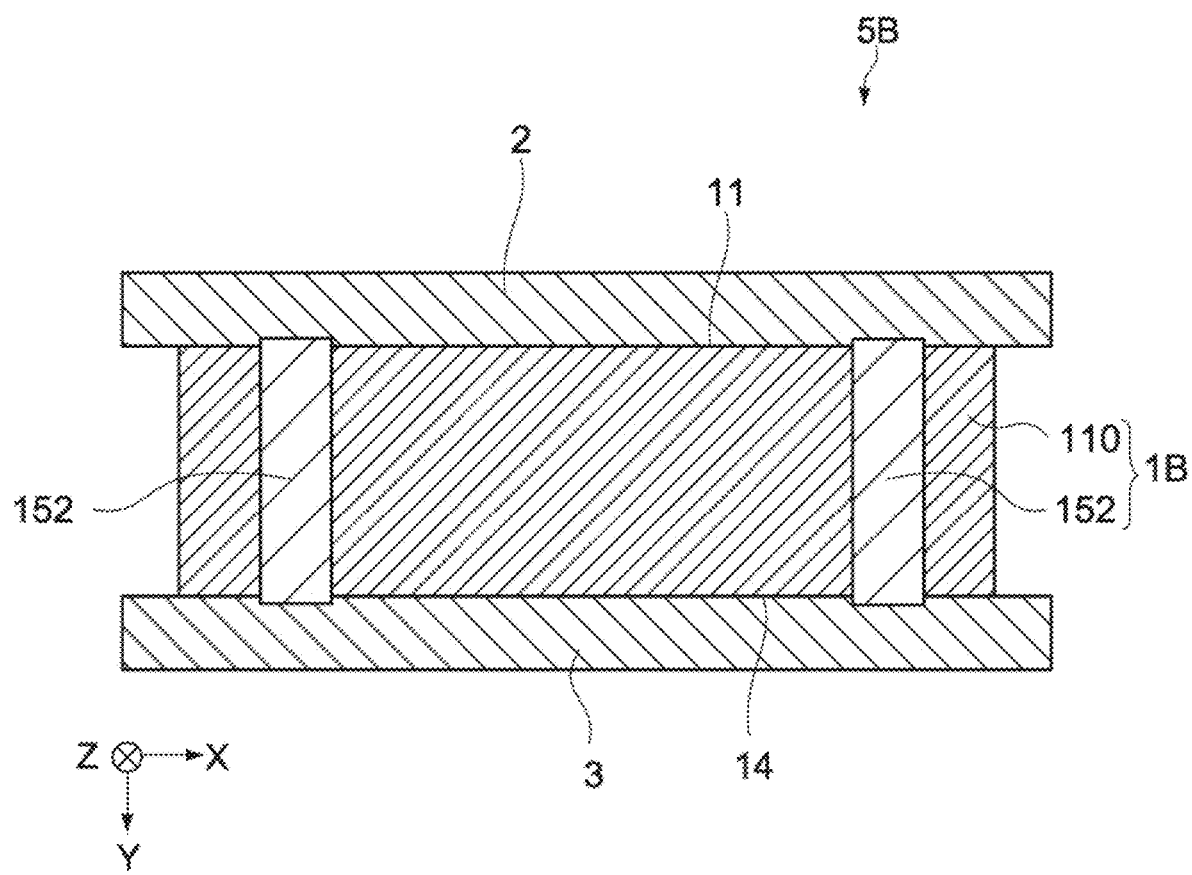

FIG. 10 is a cross-sectional side view schematically illustrating a state in which a spacer component according to another embodiment of the present technology is assembled to the front board and the rear board.

Figure 11:
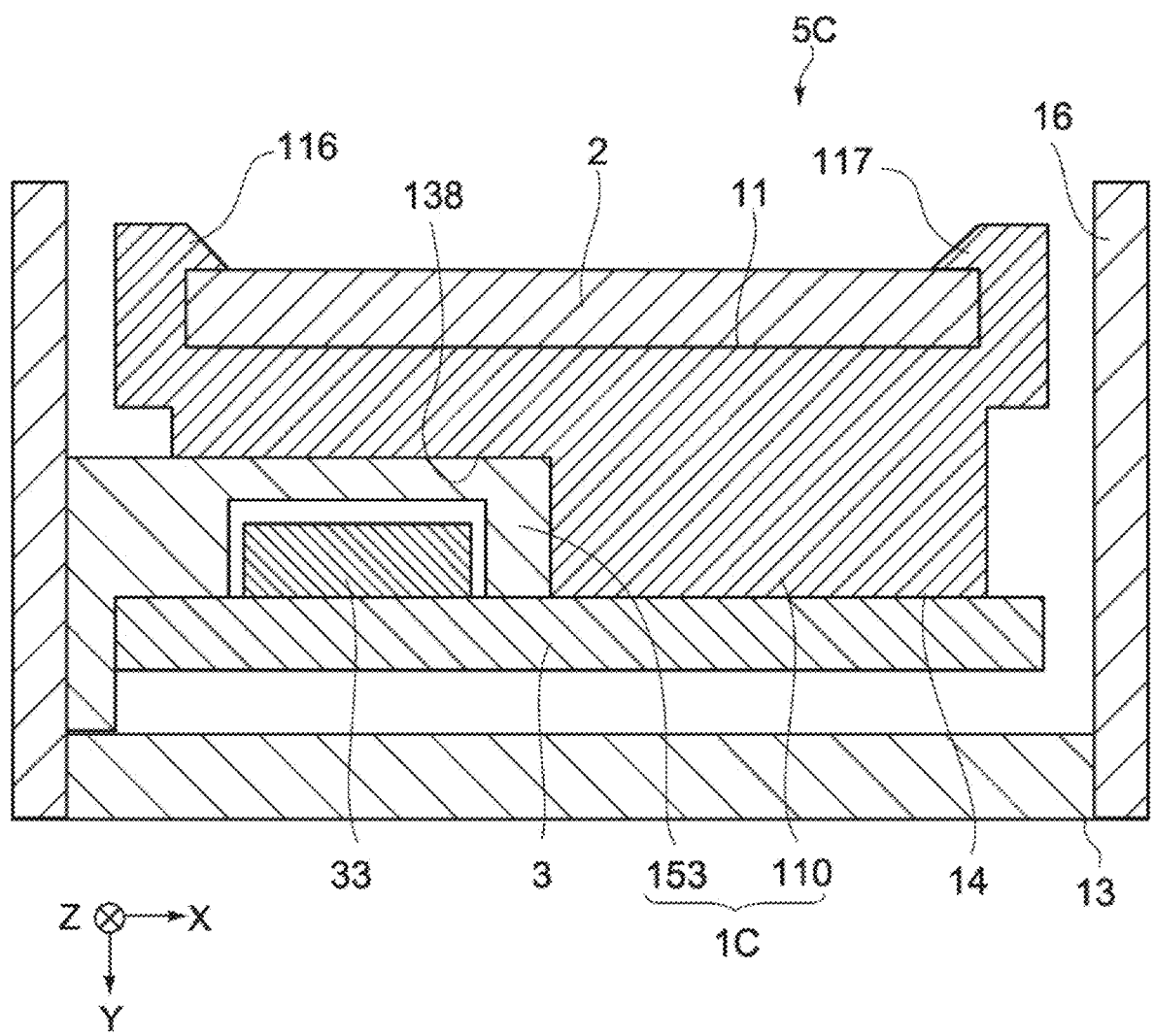

FIG. 11 is a cross-sectional side view schematically illustrating a state in which a spacer component according to another embodiment of the present technology is assembled to the front board and the rear board, and is accommodated in an external casing.

MODE(S) FOR CARRYING OUT THE INVENTION

Embodiments according to the present technology will now be described below with reference to the drawings.

[Configuration of Camera Module]

FIG. 1 is an exploded perspective view of a camera module according to an embodiment of the present technology. A camera module 100 is used as, for example, an on-vehicle camera. Of course, the present technology described below can also be applied to any camera modules used for other purposes.

In the following description, a right-and-left direction, a front-rear direction (an optical-axis direction), and a height direction of the camera module 100 are respectively set to be an X direction, a Y direction, and a Z direction. Of course, such a setting of the direction is not limitative.

The camera module 100 includes a front case 10, an O-ring 6, a camera section 4, and a rear case 13 in this order in a positive Y-axis direction.

The camera section 4 includes a lens assembly 7, a shield case 8 used for electromagnetic shielding, a dustproof sheet 9, a board unit 5, a heat dissipating sheet 18, and a spacer cushion 19 in this order in the positive Y-axis direction. The board unit 5 includes a front board (a first component-mounting board) 2, a spacer component 1, and a rear board (a second component-mounting board) 3 in this order in the positive Y-axis direction.

The front case 10 includes a front surface portion 101 that is formed nearly orthogonal to the front-rear direction (the Y direction), and a lateral surface portion 102 that extends rearward from a peripheral edge of the front surface portion 101.

In the present embodiment, the front surface portion 101 is generally rectangular as viewed from the Y direction. The front case 10 is hollow, and includes a space portion that is a region surrounded by the front surface portion 101 and the lateral surface portion 102.

The rear case 13 is a shield case used for electromagnetic shielding, and includes a rear surface portion 131 that is arranged nearly orthogonal to the front-rear direction (the Y direction), and a lateral surface portion 132 that extends forward from a peripheral edge of the rear surface portion 131. The rear surface portion 131 is generally rectangular as viewed from the Y direction, and the shape of the rear surface portion 131 is nearly identical to the shape of the front surface portion 101. The rear case 13 is hollow, and includes a space portion that is a region surrounded by the rear surface portion 131 and the lateral surface portion 132. In the present embodiment, the front case 10 and the rear case 13 each correspond to a casing.

The front case 10 and the rear case 13 are typically connected to each other by ultrasonic welding. This results in forming an internal space that includes the space portion of the front case 10 and the space portion of the rear case 13. The camera section 4 is arranged in the internal space.

As illustrated in FIG. 1, a through-hole 103 is formed in a middle portion of the front surface portion 101 of the front case 10, and a lens portion 71 of the lens assembly 7 is inserted into the through-hole 103 to assemble the lens assembly 7 to the front case 10. The camera section 4 is arranged such that an optical axis O for image-capturing passes through approximately the center of the lens assembly 7. The camera section 4 can capture an image on the basis of light that enters through the lens assembly 7.

For example, a digital camera that includes an image sensor such as a complementary metal-oxide semiconductor (CMOS) sensor or a charge coupled device (CCD) sensor is used as the camera section 4. Moreover, any cameras may be used. In the present embodiment, the camera section 4 corresponds to an image-capturing section.

A connector 135 is provided to the rear surface portion 131 of the rear case 13. The connector 135 is, for example, a coaxial connector for, for example, a flexible printed circuit (FPC) or a flexible flat cable (FFC). For example, power is supplied to the camera section 4 and an image signal is output from the camera section 4 by a cable (not illustrated) being connected to the connector 135. The configuration of the connector 135 may be designed discretionarily.

The O-ring 6 is arranged inside the front case 10 all around an inner peripheral surface of the front case 10. The O-ring 6 serves to form a seal between the front case 10 and the camera section 4 (the lens assembly 7). This prevents, for example, raindrops from entering the casing through the through-hole 103 of the front case 10.

Any elastic material such as rubber or plastic may be used as a material of the O-ring 6. In the present embodiment, the O-ring 6 corresponds to an elastic member.

The front case 10 and the rear case 13 are formed using an insulating material such as resin or ceramics. For example, engineering plastic such as a general-purpose resin such as an acrylonitrile-butadiene-styrene (ABS) resin, a polycarbonate (PC) resin, or a mixture resin of ABS and PC is used as a resin material. The resin used to perform the formation is not limited thereto, and the material and the color (transparency) of the resin used to perform the formation may be selected as appropriate.

Note that the present technology is not limited to being applied using a resin material, and, for example, die-cast components made of a metallic material may be used as the front case 10 and the rear case 13.

Further, a method for forming the front case 10 and the rear case 13 is also not limited, and, for example, any molding technology may be used to perform the formation.

[Board Unit]

Figure 2:
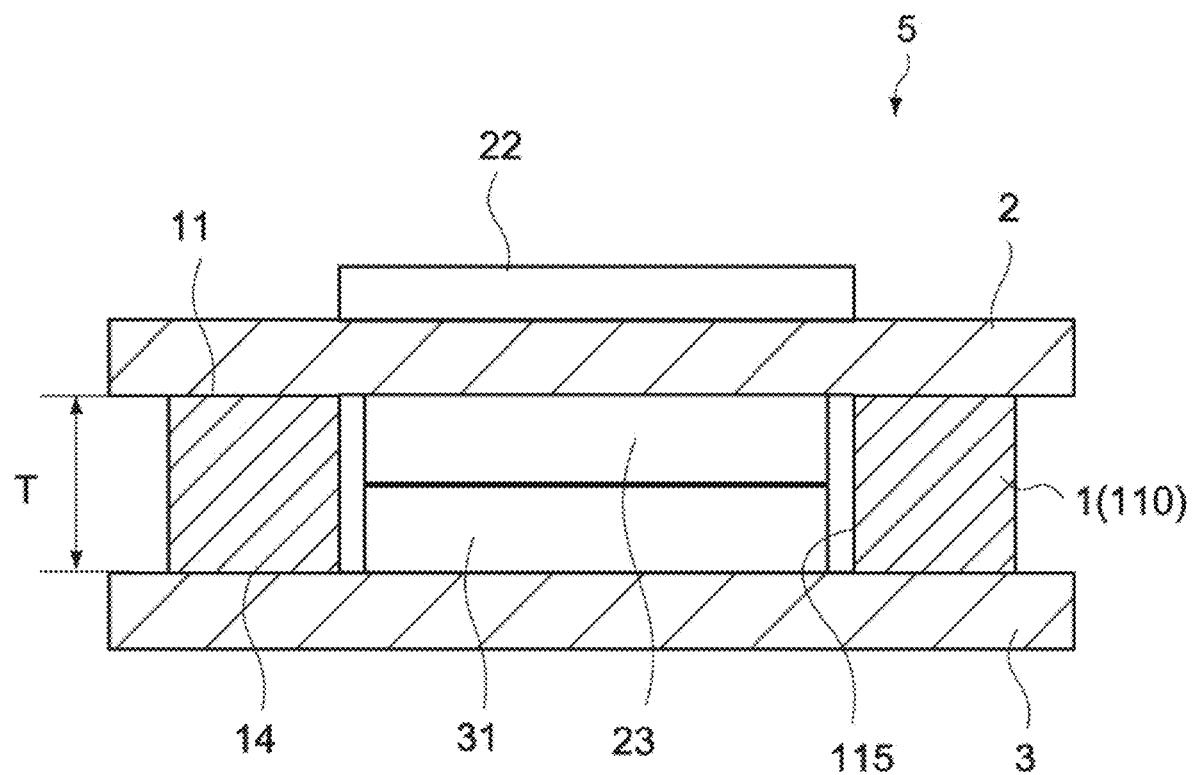
FIG. 2 is a cross-sectional side view schematically illustrating a state in which a spacer component is assembled to a front board and a rear board in the camera module of FIG. 1.

FIG. 2 is a cross-sectional side view schematically illustrating a state in which the spacer component 1 is assembled to the front board 2 and the rear board 3.

The spacer component 1 is arranged between the front board 2 and the rear board 3. The spacer component 1 includes a front surface 11 (a first primary-surface portion) that supports the front board 2, and a back surface 12 (a second primary-surface portion) that supports the rear board 3, and maintains the front board 2 and the rear board 3 at a constant distance from each other, the constant distance corresponding to a thickness T of the spacer component 1.

The spacer component 1 is a single layer of a component body 110 in the form of a plate, the component body 110 having a specified shape and having the thickness T in the Y direction. The component body 110 is an insulator, and is, for example, an injection-molded body of a synthetic resin material (a first insulating material) such as ABS resin molding, polycarbonate (PCB), or ceramics.

In the present embodiment, the spacer component 1 is a single layer of the component body 110. Thus, the spacer component 1 is hereinafter also referred to as the component body 110, unless otherwise specified. Note that the spacer component may be configured to include a component body and a layer that is formed integrally with the component body and is made of a material of a type that is different from the type of material of the component body. This will be described later.

The front board 2 is a rectangular, rigid double-sided component mounting board. Electronic components including an imaging device 22 are mounted on a front surface of the front board 2 (an upper surface of the front board 2 in FIG. 2). Various electronic components used to drive the imaging device 22, and a first connector component 23 used to make a B-to-B connection are mounted on a back surface of the front board 2 (a lower surface of the front board 2 in FIG. 2). The imaging device 22 is a solid-state imaging device such as a CMOS or CCD image sensor.

The rear board 3 is a rectangular, rigid double-sided component mounting board. The rear board 3 is typically formed to be sized equally to the front board 2. Another electronic component used to drive the imaging device 22, and a second connector component 31 that is electrically connected to the first connector component 23 are mounted on a front surface of the rear board 3 (an upper surface of the rear board 3 in FIG. 2).

In addition to the imaging device 22 and the connector components 23 and 31 described above, the electronic components mounted on the front board 2 and the rear board 3 also include IC components that are included in, for example, a digital signal processor (DSP), a central processing unit (CPU), and a power source circuit; and passive components such as a coil, a resistance, and a capacitor.

The spacer component 1 includes a component accommodation portion 115 that accommodates therein the first connector component 23 and the second connector component 31. The component accommodation portion 115 is a concave portion without a bottom, or a through-hole that has a specified shape and passes through the component body 110. Further, an escape portion (a concave portion) is provided to the front surface and the back surface of the spacer component 1, the escape portion being used to prevent interference between the spacer component 1 and the various electronic components mounted on the back surface of the front board 2 and the front surface of the rear board 3.

The front board 2 and the rear board 3 are mechanically and electrically connected to each other through the first connector component 23 and the second connector component 31. When the first connector component 23 and the second connector component 31 are connected to each other, the front board 2 is brought into contact with the front surface 11 of the spacer component 1, and the rear board 3 is brought into contact with the back surface 14 of the spacer component 1.

Figure 3:
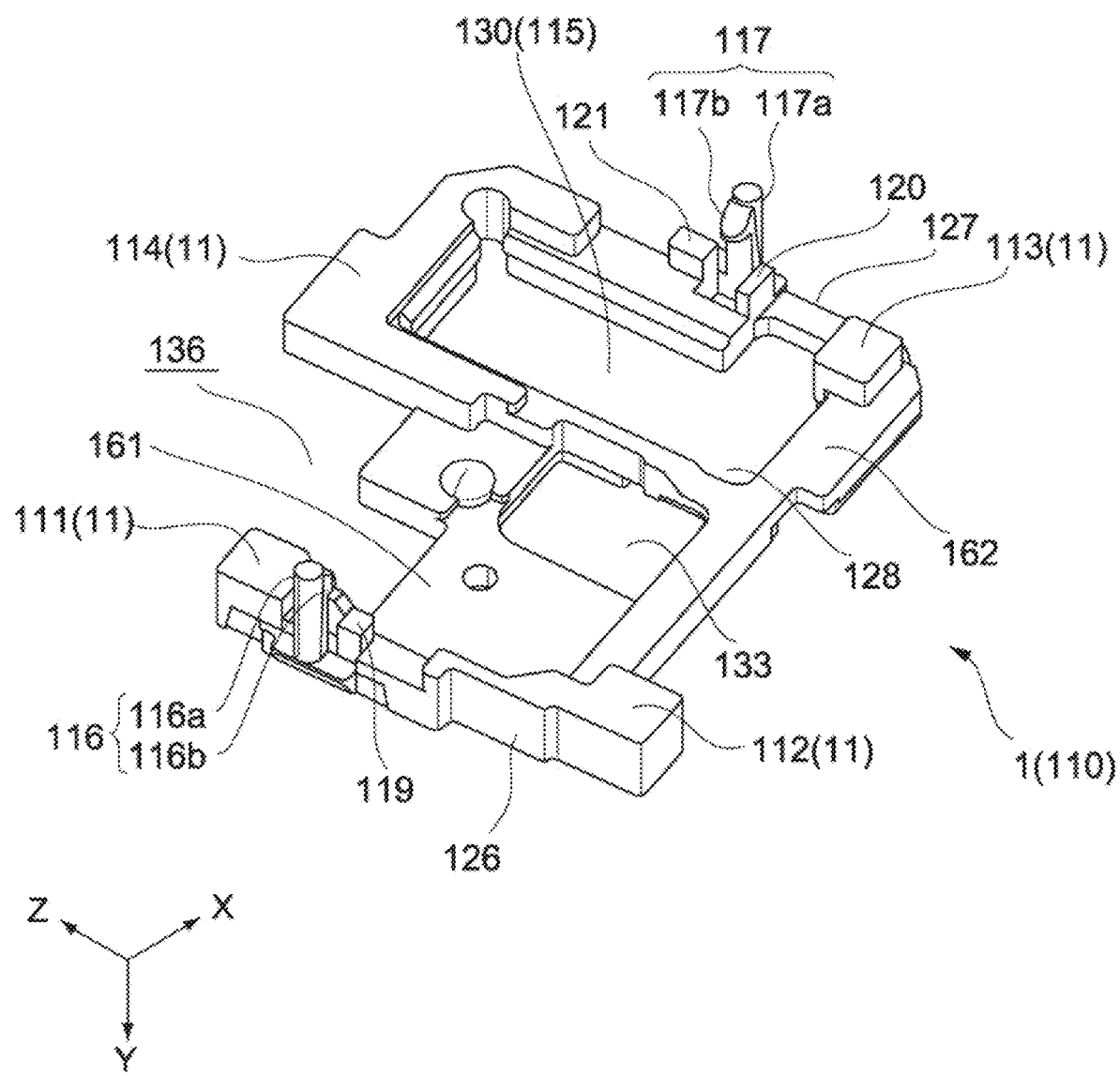
FIG. 3 is a top perspective view of the spacer component in the camera module of FIG. 1.

Next, the spacer component 1 is described in detail. FIG. 3 is a top perspective view of the spacer component 1. (A) of FIG. 4 is a bottom perspective view illustrating a state in which the spacer component 1 is assembled to the front board 2, and (B) of FIG. 4 is a top perspective view illustrating a state in which the spacer component 1 is assembled to the rear board 3. (A) of FIG. 5 is a top perspective view illustrating a state in which the spacer component 1 is assembled to the front board 2 and the rear board 3, (B) of FIG. 5 is a cross-sectional perspective view illustrating the state of (A), and (C) of FIG. 5 is a cross-sectional side view illustrating the state of (A).

The spacer component 1 is generally rectangular in appearance. The size of the spacer component 1 is not particularly limited, and is typically formed to be sized nearly equally to the front board 2 and the rear board 3.

The surface 11 of the spacer component 1 is formed of a plurality of reference surfaces (first reference surfaces). As illustrated in FIG. 3 and (B) of FIG. 4, the plurality of reference surfaces includes four reference surfaces 111, 112, 113, and 114. The reference surfaces 111 to 114 of the plurality of reference surfaces are planar portions that are in plane with each other (belong to the front surface 11), and are brought into contact with the back surface of the front board 2 when the spacer component 1 and the front board 2 are arranged in a layered formation (refer to (C) of FIG. 5).

Note that the reference surfaces 111 to 114 of the plurality of reference surfaces may be in different planes without being in plane with each other.

Locations at which the reference surfaces 111 to 114 are formed are not particularly limited, and can be set as appropriate according to the locations and the sizes of the components mounted on the back surface of the front board 2. The reference surfaces 111 to 114 are typically formed in a peripheral edge of the front surface 11 of the spacer component 1 to support a region, on the back surface of the front board 2, on which no component is mounted. In the present embodiment, the reference surfaces 111 to 114 are respectively formed at four corners of the front surface 11 of the spacer component 1.

Shapes and sizes of the reference surfaces 111 to 114 are not particularly limited, and the reference surfaces 111 to 114 are typically formed to have different shapes and different sizes. In the present embodiment, the reference surfaces 111 and 113 are each formed into a rectangular island, the reference surface 112 is linearly formed, and the reference surface 114 is formed to have a shape that includes a bent portion.

Note that the front surface 11 of the spacer component 1 is not limited to being formed of the four reference surfaces 111 to 114 described above, and may be formed of at least three reference surfaces. This makes it possible to stably support the front board 2.

Each of the reference surfaces 111 to 114 is formed by a recess of any depth being provided to any region of the front surface 11 of the spacer component 1. In the present embodiment, two recesses 161 and 162 are primarily formed. Regions in which the recesses 161 and 162 are formed correspond to thin portions of the spacer component 1.

The recess 161 is formed to be deeper than the recess 162. The recess 161 is formed to connect the reference surface 111, the reference surface 112, and the reference surface 114. The recess 162 is formed to connect the reference surface 112, the reference surface 113, and the reference surface 114.

The spacer component 1 includes a component accommodation portion 130 (a first component-accommodation portion) that accommodates therein the first connector component 23 and the second connector component 31 described above (refer to FIG. 2). As illustrated in FIG. 3, the component accommodation portion 130 is a generally rectangular through-hole that passes through the recess 162. The component accommodation portion 130 corresponds to the component accommodation portion 115 in FIG. 2.

Further, the spacer component 1 includes a component accommodation portion 133 that can accommodate therein an electronic component other than the first connector component 23 and the second connector component 31. As illustrated in FIG. 3, the component accommodation portion 133 is a generally rectangular through-hole that passes through the recess 161.

Furthermore, the spacer component 1 includes a missing portion 136 obtained by removing a portion from the recess 161. The missing portion 136 is provided between the reference surface 111 and the reference surface 114.

The recesses 161 and 162 and the missing portion 136 serve as escape portions used to prevent interference between the spacer component 1 and a group of the components mounted on the back surface of the front board 2. (refer to (A) of FIG. 4).

On the other hand, the component accommodation portion 133 serves as an escape portion used to prevent interference between the spacer component 1 and the electronic components mounted on the front surface of the rear board 3 (refer to (B) of FIG. 4).

A plurality of engagement protrusions 116 and 117 used to control misalignment between the spacer component 1 and the front board 2 is provided to the front surface 11 of the spacer component 1. The engagement protrusion 116 includes a stem portion 116a and a claw portion 116b, the stem portion 116a being provided to a side edge 126 that is one of two side edges of the primary surface 11 of the spacer component 1, the claw portion 116b being provided to a tip of the stem portion 116a. The engagement protrusion 117 includes a stem portion 117a and a claw portion 117b, the stem portion 117a being provided to a side edge 127 that is another of the two side edges of the primary surface 11 of the spacer component 1, the claw portion 117b being provided to a tip of the stem portion 117a, the side edge 126 and the side edge 127 facing each other in the X direction.

The stem portions 116a and 116b may be provided to face each other in the X direction, or may be provided to be offset from each other in the Z direction, as illustrated in FIG. 3.

The claw portions 116b and 117b are respectively formed to protrude from the respective tips of the stem portions 116a and 116b in parallel with the X direction, such that the claw portions 116b and 117b can be engaged with the front surface of the front board 2. Configurations of the claw portions 116b and 117b are not particularly limited, and it is sufficient if the claw portions 116b and 117b are formed such that the spacer component 1 can be arranged in snap-fit connection with the front board 2.

The number of the engagement protrusions is not limited to two, and may be three or more.

Concave portions 201 and 202 into which the stem portions 116a and 117a of the engagement protrusions 116 and 117 are respectively inserted, are respectively provided to side edges of the front board 2 that face each other (refer to (A) of FIG. 4 and (B) of FIG. 5). The concave portions 201 and 202 respectively have opening widths that are respectively sized nearly equally to stem diameters of the stem portions 116a and 117a, and control misalignment of the front board 2 with respect to the spacer component 1 in an XZ in-plane direction by the stem portions 116a and 117a respectively being inserted into the concave portions 201 and 202.

Reception portions 118 and 119 are formed near the stem portion 116a of the engagement protrusion 116, and reception portions 120 and 121 are formed near the stem portion 117a of the engagement protrusion 117 (refer to FIG. 3 and (B) of FIG. 4). The reception portions 118 to 121 are in plane with the reference surfaces 111 to 114, and support the back surface of the front board 2 together with the reference surfaces 111 to 114 when the engagement protrusions 116 and 117 are engaged with the front board 2.

Likewise, a plurality of reference surfaces (second reference surfaces) is provided on the back surface 14 of the spacer component 1. As illustrated in (A) of FIG. 4, the plurality of reference surfaces includes four reference surfaces 141, 142, 143, and 144. The reference surfaces 141 to 144 of the plurality of reference surfaces are planar portions that are in plane with each other, and are brought into contact with the front surface of the rear board 3 when the spacer component 1 and the rear board 3 are arranged in a layered formation (refer to (C) of FIG. 5).

Note that the reference surfaces 141 to 144 of the plurality of reference surfaces may be in different planes without being in plane with each other.

Locations at which the reference surfaces 141 to 144 are formed are not particularly limited, and can be set as appropriate according to the locations and the sizes of the components mounted on the front surface of the rear board 3. The reference surfaces 141 to 144 are typically formed in a peripheral edge of the back surface 12 of the spacer component 1 to support a region, on the front surface of the rear board 3, on which no component is mounted. In the present embodiment, the reference surfaces 141 to 144 are respectively formed at four corners of the back surface 14 of the spacer component 1.

Shapes and sizes of the reference surfaces 141 to 144 are not particularly limited, and, in the present embodiment, the reference surfaces 141 to 144 are each formed of a seat surface portion in the form of a circular plate, the seat surface portion protruding from the back surface 14 by a specified height in the Y direction.

Note that the number of the reference surfaces 141 to 144 is not limited to four, and it is sufficient if there are at least three reference surfaces. This makes it possible to stably support the rear board 3.

The degree of parallelism of the front board 2 and the rear board 3 can be improved and maintained by assembling the spacer component 1 described above to the front board 2 and the rear board 3 (described later).

The number of components can be reduced by reducing, to one (the spacer component 1), the number of components used to control a distance between the front board 2 and the rear board 3 (a reduction in the number of factors of variations in component and assembly). Heights of components can be controlled as a whole by forming the spacer blocks between the boards 2 and 3 into one component. This makes it possible to contribute toward controlling inclination of the boards 2 and 3 with respect to each other, and to make the components themselves larger in size. This results in facilitating an assembly operation.

The contact area of a portion used to receive the front board 2 and the rear board 3 can be made larger by designing the spacer component 1 according to a layout of the front board 2 and the rear board 3. This makes it possible to prevent the boards 2 and 3 from being inclined with respect to each other. This results in reducing, upon performing an operation of B-to-B connection, load imposed on a connector. This also results in reducing damage due to oscillation generated by the camera module 100 after a connector is mounted.

The addition of the engagement protrusions 116 and 117 each having a snap-fit shape results in there being no need to perform an operation of fixing the spacer component 1 to the front board 2 using, for example, an adhesive or a sticky paper, and thus to perform handling more easily.

The stem portions 116a and 116b of the engagement protrusions 116 and 117 that are respectively assembled into the concave portions 201 and 202 of the front board 2 serve as guides upon assembling, and this makes it easier to perform handling upon making B-to-B connection between the boards 2 and 3 (facilitating an assembly operation).

[Method for Producing Camera Module]

Next, a method for producing a camera module (an assembly method) according to an embodiment of the present technology is described. FIGS. 6 to 8 are perspective views illustrating respective steps and being used to describe a method for producing the camera module 100.

First, as illustrated in (A) and (B) of FIG. 6, the spacer component 1 is assembled to the front board 2, and thus the front board 2 is placed on the primary surface (the reference surfaces 111 to 114) of the spacer component 1. Here, the stem portions of the engagement protrusions 116 and 117 of the spacer component 1 are respectively inserted into the concave portions 201 and 202 of the front board 2 in the Y-axis direction to be respectively assembled to the concave portions 201 and 202 (snap-fit connection). The claw portions 116b and 117b of the engagement protrusions 116 and 117 are engaged with a surface of the front board 2 that is opposite to a surface of the front board 2 that faces the spacer component 1, and thus the spacer component 1 and the front board 2 are integrated with each other. This results in preventing the front board 2 from falling off the spacer component 1 even when the spacer component 1 is turned upside down, and thus in performing handling more easily (facilitating an assembly operation).

Next, as illustrated in (A) of FIG. 7, the spacer component 1 is turned upside down, and a multilayer body 501 of the spacer component 1 and the front board 2 is assembled to the rear board 2. Consequently, the rear board 3 is placed on the back surface 14 (the reference surfaces 141 to 144) of the spacer component 1, and the front board 2 and the rear board 3 are electrically and mechanically connected to each other through the first connector component 23 and the second connector component 31.

Next, as illustrated in (B) of FIG. 7, a multilayer body 502 (the board unit 5) of the spacer component 1, the front board 2, and the rear board 3 is assembled to the lens assembly 7 through the shield case 8 and the dustproof sheet 9 (an obtained body is referred to as a multilayer body 503).

Next, as illustrated in (A) of FIG. 8, the multilayer body 503 is assembled to the rear case 13 through the heat dissipating sheet 18 and the spacer cushion 19.

Then, as illustrated in (B) of FIG. 8, a combining body 504 obtained by combining the multilayer body 503 and the rear case 13 is assembled to the front case 10 through the O-ring 6, and thus the camera module 100 is produced. In the present embodiment, the rear case 13 and the front case 10 are integrated with each other by ultrasonic welding to form a casing that integrally accommodates therein various components such as the board unit 5.

Inside the casing, the board unit 5 is sandwiched between the front case 10 and the rear case 13 due to an elastic force of the spacer cushion 19. Here, the front board 2 is supported by the plurality of reference surfaces 111 to 114 of the front surface 11 of the spacer component 1, and the rear board 3 is supported by the plurality of reference surfaces 141 to 144 of the back surface 14 of the spacer component 1.

[Other Embodiments of Spacer Component]

As other embodiments, the material of the spacer component may be partially changed to cause the spacer component to include an additional function as indicated below.

FIGS. 9 to 11 are schematic cross-sectional side views of spacer components of the other embodiments. The front board 2 and the rear board 3 are assembled to each spacer component. Note that the embodiments of FIGS. 9 to 11 may be combined with each other.

FIG. 9 illustrates a board unit 5A that includes a spacer component 1A.

The spacer component 1A includes a component body 110 and a covering layer 151. The component body 110 includes, on its back surface 14, a component accommodation portion 134 with a bottom (a second component-accommodation portion). The covering layer 154 covers the component accommodation portion 134 to form an inner surface of the component accommodation portion 134.

The covering layer 151 is made of an insulating material (a second insulating material) that is different from the material (the first insulating material) of the component body 110. In the present embodiment, the covering layer 151 is made of an electromagnetic absorbent insulating material. Examples of such a material include a composite material such as a synthetic resin or elastomer that includes an electromagnetic absorbent material such as soft magnetic particles. This makes it possible to prevent electromagnetic waves radiated from an electronic component 32 accommodated in the component accommodation portion 134 from leaking out of the component accommodation portion 134. Consequently, even if the component accommodation portion 134 is provided to a portion that faces the imaging device 22 in a thickness direction of the spacer component 1A, as illustrated in the figure, an effect of electromagnetic noise on the imaging device 22 can be reduced, the electromagnetic noise coming from the electronic component 32.

A method for forming the covering layer 151 is not particularly limited, and, in the present embodiment, the covering layer 151 is molded integrally with the component body 110 by double molding. Moreover, the covering layer 151 molded in advance may be joined to the inner surface of the component accommodation portion 134.

FIG. 10 illustrates a board unit 5B that includes a spacer component 1B.

The spacer component 1B includes the component body 110 and an interlayer connection portion 152. The interlayer connection portion 152 passes through the component body 110 in thickness direction of the component body 110, and makes an electrical connection between the front board 2 supported on the front surface 11 of the component body 110, and the rear board 3 supported on the back surface 14 of the component body 110. The interlayer connection portion 152 is formed using a conductive plastic material that includes a metal material or metal particles, and is molded integrally with the component body 110 by, for example, insert molding or double molding. The interlayer connection portion 152 may be configured as a portion of wiring of the front board 2 and the rear board 3, and is, for example, configured as a ground line of the board unit 5.

FIG. 11 illustrates a board unit 5C that includes a spacer component 1C.

The spacer component 1C includes the component body 110 and a covering layer 153. The component body 110 includes, on its back surface 14, a component accommodation portion 138 with a bottom (the second component-accommodation portion). The covering layer 154 covers the component accommodation portion 138 to form an inner surface of the component accommodation portion 138.

The covering layer 153 is made of an insulating material (the second insulating material) that is different from the material (the first insulating material) of the component body 110. In the present embodiment, the covering layer 153 is made of an insulating material that is more highly thermally conductive than the component body 110. Examples of such a material include a composite material such as a synthetic resin or elastomer that includes a metallic filler. This results in obtaining an electronic component 33 having more excellent heat dissipation properties, the electronic component 33 being accommodated in the component accommodation portion 138 and generating a relatively large amount of heat.

A method for forming the covering layer 153 is not particularly limited, and, in the present embodiment, the covering layer 153 is molded integrally with the component body 110 by double molding. Moreover, the covering layer 151 molded in advance may be joined to the inner surface of the component accommodation portion 134.

<Application Examples>

The technology according to the present disclosure can be applied to various products. For example, the technology according to the present disclosure may be provided as a camera module that is included in one of the types of mobile bodies such as vehicle, electric vehicle, hybrid electric vehicle, motorcycle, bicycle, personal mobility, airplane, drone, ship, robot, construction machinery, and agricultural machinery (a tractor).

The respective configurations of the camera module, the front case, the rear case, the packing, and the like described with reference to the respective figures are merely embodiments, and any modifications may be made thereto without departing from the spirit of the present technology. In other words, any other configurations for practicing the present technology may be adopted.

In the present disclosure, expressions such as "approximately the center", "center portion", "middle portion", "nearly identical", "orthogonal", "nearly orthogonal", "rectangular", "generally rectangular", and "circular" include, in concept, expressions such as "substantially the center", "substantially the middle", "substantially identical", and "substantially approximately the middle". For example, the expressions such as "approximately the center", "center portion", "middle portion", "nearly identical", "orthogonal", "nearly orthogonal", "rectangular", "generally rectangular", and "circular" also include states within specified ranges (such as a range of +/−10%), with expressions such as "exactly the center", "exactly the middle", "exactly identical", "exactly approximately the middle", "completely orthogonal", "perfectly rectangular", and "perfectly circular", respectively being used as references.

Note that the present technology may also take the following configurations.

(1) A camera module, including:
a first component-mounting board that includes an imaging device;
a second component-mounting board that is electrically connected to the first component-mounting board; and
a spacer component that is arranged between the first component-mounting board and the second component-mounting board,
the spacer component including a component body that is made of a first insulating material, the component body including a first primary-surface portion that includes a plurality of first reference surfaces including at least three first reference surfaces, a second primary-surface portion that includes a plurality of second reference surfaces including at least three second reference surfaces, and a component accommodation portion with or without a bottom, the first primary-surface portion being brought into contact with the first component-mounting board, the second primary-surface portion being brought into contact with the second component-mounting board, the component accommodation portion being provided to at least one of the first primary-surface portion or the second primary-surface portion.

(2) The camera module according to (1), in which
the plurality of first reference surfaces and the plurality of second reference surfaces are respectively provided to a peripheral edge of the first primary-surface portion and a peripheral edge of the second primary-surface portion.

(3) The camera module according to (1) or (2), in which
the component accommodation portion includes a first component-accommodation portion that is a through-hole,
the first component-mounting board further includes a first connector component that is accommodated in the component accommodation portion, and
the second component-mounting board includes a second connector component that is accommodated in the component accommodation portion and connected to the first connector component.

(4) The camera module according to any one of (1) to (3), in which
the component body further includes a plurality of engagement protrusions that controls misalignment between the spacer component and the first component-mounting board.

(5) The camera module according to (4), in which
each of the plurality of engagement protrusions includes
a stem portion that is provided to a corresponding one of two side edges of the first primary-surface portion, the two side edges facing each other, and
a claw portion that is provided to a tip of the stem portion, the claw portion being engaged with a surface of the first component-mounting board that is opposite to a surface of the first component-mounting board that faces the spacer component.

(6) The camera module according to (4) or (5), in which
the first component-mounting board includes a concave portion that is provided to a corresponding one of two side edges of the first component-mounting board, the stem portion being inserted into the concave portion.

(7) The camera module according to any one of (1) to (6), in which
the component accommodation portion further includes a second component-accommodation portion with a bottom, and
the spacer component further includes a covering layer that is made of a second insulating material that is different from the first insulating material, the covering layer forming an inner surface of the second component-accommodation portion.

(8) The camera module according to (7), in which
the second insulating material is a composite material that includes an electromagnetic absorbent material.

(9) The camera module according to (7) or (8), in which
the second component-accommodation portion is provided to a portion that faces the imaging device in a thickness direction of the spacer component.

(10) The camera module according to any one of (7) to (9), in which
the second insulating material is more highly thermally conductive than the first insulating material.

(11) The camera module according to any one of (1) to (10), in which
the spacer component further includes an interlayer connection portion that is provided within the component body, the interlayer connection portion making an electrical connection between the first component-mounting board and the second component-mounting board.

(12) The camera module according to any one of (1) to (11), further including:
a casing that integrally accommodates therein a multilayer body of the first component-mounting board, the spacer component, and the second component-mounting board.

(13) A spacer component, including
a component body that is made of an insulating material, the component body including a first primary-surface portion that includes a plurality of first reference surfaces, a second primary-surface portion that includes a plurality of second reference surfaces, and a component accommodation portion with or without a bottom, the first primary-surface portion being brought into contact with a first component-mounting board, the second primary-surface portion being brought into contact with a second component-mounting board, the component accommodation portion being provided to at least one of the first primary-surface portion or the second primary-surface portion.

(14) A method for producing a camera module, including:
providing a spacer component that is made of an insulating material, the spacer component including a first primary-surface portion that includes a plurality of first reference surfaces, a second primary-surface portion that includes a plurality of second reference surfaces, and a component accommodation portion without a bottom, the first primary-surface portion being brought into contact with a first component-mounting board that includes an imaging device, the second primary-surface portion being brought into contact with a second component-mounting board, the component accommodation portion being provided to at least one of the first primary-surface portion or the second primary-surface portion;

arranging the first component-mounting board in snap-fit connection with the spacer component;

placing the first component-mounting board on the plurality of first reference surfaces to cause a first connector component to be accommodated in the component accommodation portion, the first connector component being mounted on the first component-mounting board;

turning the spacer component upside down; and placing the second component-mounting board on the plurality of second reference surfaces to connect a second connector component to the first connector component in the component accommodation portion, the second connector component being mounted on the second component-mounting board.

REFERENCE SIGNS LIST 1, 1A, 1B, 1C spacer component
2 front board (first component-mounting board)
3 rear board (second component-mounting board)
5, 5A, 5B, 5C board unit
10 front case (casing)
11 front surface of spacer component (first primary-surface portion)
13 rear case (casing)
14 back surface of spacer component (second primary-surface portion)
22 imaging device
23 first connector component
31 second connector component
100 camera module
110 component body
111 to 114 first reference surface
115, 130 component accommodation portion (first component-accommodation portion)
116, 117 engagement protrusion
134, 138 component accommodation portion (second component-accommodation portion)
141 to 144 second reference surface
151, 153 covering layer
152 interlayer connection section

The invention claimed is:

1. A camera module, comprising:
a first component-mounting board that includes an imaging device;
a second component-mounting board that is electrically connected to the first component-mounting board; and
a spacer component that is arranged between the first component-mounting board and the second component-mounting board,
the spacer component including a component body that is made of a first insulating material, the component body including a first primary-surface portion that includes a plurality of first reference surfaces including at least three first reference surfaces, a second primary-surface portion that includes a plurality of second reference surfaces including at least three second reference surfaces, and a component accommodation portion with or without a bottom, the first primary-surface portion being brought into contact with the first component-mounting board, the second primary-surface portion being brought into contact with the second component-mounting board, the component accommodation portion being provided to at least one of the first primary-surface portion or the second primary-surface portion.

2. The camera module according to claim 1, wherein the plurality of first reference surfaces and the plurality of second reference surfaces are respectively provided to a peripheral edge of the first primary-surface portion and a peripheral edge of the second primary-surface portion.

3. The camera module according to claim 1, wherein the component accommodation portion includes a first component-accommodation portion that is a through-hole,
the first component-mounting board further includes a first connector component that is accommodated in the component accommodation portion, and
the second component-mounting board includes a second connector component that is accommodated in the component accommodation portion and connected to the first connector component.

4. The camera module according to claim 1, wherein the component body further includes a plurality of engagement protrusions that controls misalignment between the spacer component and the first component-mounting board.

5. The camera module according to claim 4, wherein each of the plurality of engagement protrusions includes
a stem portion that is provided to a corresponding one of two side edges of the first primary-surface portion, the two side edges facing each other, and
a claw portion that is provided to a tip of the stem portion, the claw portion being engaged with a surface of the first component-mounting board that is opposite to a surface of the first component-mounting board that faces the spacer component.

6. The camera module according to claim 5, wherein the first component-mounting board includes a concave portion that is provided to a corresponding one of two side edges of the first component-mounting board, the stem portion being inserted into the concave portion.

7. The camera module according to claim 1, wherein the component accommodation portion further includes a second component-accommodation portion with a bottom, and
the spacer component further includes a covering layer that is made of a second insulating material that is different from the first insulating material, the covering layer forming an inner surface of the second component-accommodation portion.

8. The camera module according to claim 7, wherein the second insulating material is a composite material that includes an electromagnetic absorbent material.

9. The camera module according to claim 8, wherein the second component-accommodation portion is provided to a portion that faces the imaging device in a thickness direction of the spacer component.

10. The camera module according to claim 7, wherein the second insulating material is more highly thermally conductive than the first insulating material.

11. The camera module according to claim 1, wherein the spacer component further includes an interlayer connection portion that is provided within the component body, the interlayer connection portion making an electrical connection between the first component-mounting board and the second component-mounting board.

12. The camera module according to claim 1, further comprising:
a casing that integrally accommodates therein a multilayer body of the first component-mounting board, the spacer component, and the second component-mounting board.

13. A spacer component, comprising
a component body that is made of an insulating material, the component body including a first primary-surface portion that includes a plurality of first reference surfaces, a second primary-surface portion that includes a plurality of second reference surfaces, and a component accommodation portion with or without a bottom, the first primary-surface portion being brought into contact with a first component-mounting board, the second primary-surface portion being brought into contact with a second component-mounting board, the component accommodation portion being provided to at least one of the first primary-surface portion or the second primary-surface portion.

14. A method for producing a camera module, comprising:
providing a spacer component that is made of an insulating material, the spacer component including a first primary-surface portion that includes a plurality of first reference surfaces, a second primary-surface portion that includes a plurality of second reference surfaces, and a component accommodation portion without a bottom, the first primary-surface portion being brought into contact with a first component-mounting board that includes an imaging device, the second primary-surface portion being brought into contact with a second component-mounting board, the component accommodation portion being provided to at least one of the first primary-surface portion or the second primary-surface portion;
arranging the first component-mounting board in snap-fit connection with the spacer component;
placing the first component-mounting board on the plurality of first reference surfaces to cause a first connector component to be accommodated in the component accommodation portion, the first connector component being mounted on the first component-mounting board;
turning the spacer component upside down; and
placing the second component-mounting board on the plurality of second reference surfaces to connect a second connector component to the first connector component in the component accommodation portion, the second connector component being mounted on the second component-mounting board.

* * * * *